(12) United States Patent
Thomas et al.

(10) Patent No.: US 11,975,962 B2
(45) Date of Patent: May 7, 2024

(54) HERMETICALLY SEALED TRANSPARENT CAVITY AND PACKAGE FOR SAME

(71) Applicant: Schott AG, Mainz (DE)

(72) Inventors: Jens Ulrich Thomas, Mainz (DE); Thomas Zetterer, Landshut (DE); Yutaka Onezawa, Otsu (JP); Antti Määttänen, Tampere (SE); Kurt Nattermann, Ockenheim (DE); Robert Hettler, Kumhausen (DE)

(73) Assignee: Schott AG, Mainz (DE)

( * ) Notice: Subject to any disclaimer, the term of this patent is extended or adjusted under 35 U.S.C. 154(b) by 53 days.

(21) Appl. No.: 17/582,514

(22) Filed: Jan. 24, 2022

(65) Prior Publication Data
US 2022/0144627 A1  May 12, 2022

Related U.S. Application Data

(63) Continuation of application No. PCT/EP2020/070934, filed on Jul. 24, 2020.

(30) Foreign Application Priority Data

Jul. 24, 2019  (DE) ............ 10 2019 119 961.1

(51) Int. Cl.
*B81B 7/00* (2006.01)
*B81C 1/00* (2006.01)

(52) U.S. Cl.
CPC ........ *B81B 7/0058* (2013.01); *B81C 1/00333* (2013.01); *B81C 2203/0118* (2013.01)

(58) Field of Classification Search
None
See application file for complete search history.

(56) References Cited

U.S. PATENT DOCUMENTS 6,661,084 B1 * 12/2003 Peterson ............... H01L 23/10
257/737
6,809,413 B1 * 10/2004 Peterson ............... H01L 23/10
257/737

(Continued)

FOREIGN PATENT DOCUMENTS

AU  2021223713 A1 *  9/2022 .......... B23K 26/206
CN  101807672 A  8/2010

(Continued)

OTHER PUBLICATIONS

Notification of the Transmission of the International Search Report and Written Opinion of the International Search Authority or Declaration dated Nov. 23, 2020 for International Application No. PCT/EP2020/070934 (16 pages).

*Primary Examiner* — Michael Lebentritt
(74) *Attorney, Agent, or Firm* — Taylor IP, P.C.

(57) ABSTRACT

A hermetically sealed package includes: at least one cover substrate and a substrate arranged so as to adjoin the at least one cover substrate, which together define at least part of the package, the at least one cover substrate being in a thermally prestressed state and bonded to the substrate adjoining the at least one cover substrate in a hermetically sealing manner by at least one laser bonding line, the at least one cover substrate being made of a material which has a different characteristic value of a coefficient of thermal expansion than the adjoining substrate and a thermal prestress is established in the package; and at least one functional area enclosed in the package.

20 Claims, 7 Drawing Sheets

(56) References Cited

U.S. PATENT DOCUMENTS

| | | | |
|---|---|---|---|
| 6,896,949 B1* | 5/2005 | Scobey | G01J 3/26 |
| | | | 359/260 |
| 8,697,242 B2 | 4/2014 | Kawanami et al. | |
| 10,011,525 B2 | 7/2018 | Logunov et al. | |
| 10,069,104 B2 | 9/2018 | Dabich, II et al. | |
| 10,283,731 B2 | 5/2019 | Dabich, II et al. | |
| 10,364,144 B2* | 7/2019 | Herbsommer | H03L 7/26 |
| 2001/0038365 A1 | 11/2001 | Igeta | |
| 2006/0191215 A1* | 8/2006 | Stark | E06B 3/66342 |
| | | | 52/204.6 |
| 2012/0170257 A1 | 7/2012 | Van Dijk et al. | |
| 2013/0287989 A1 | 10/2013 | Kawanami | |
| 2016/0039664 A1 | 2/2016 | Lodden et al. | |
| 2017/0047542 A1 | 2/2017 | Dejneka et al. | |
| 2017/0210662 A1 | 7/2017 | Wagner et al. | |
| 2018/0345644 A1 | 12/2018 | Kang et al. | |
| 2018/0350704 A1 | 12/2018 | Hettler | |
| 2019/0047902 A1 | 2/2019 | Boek et al. | |

FOREIGN PATENT DOCUMENTS

| | | | | |
|---|---|---|---|---|
| CN | 103354950 A | 10/2013 | | |
| EP | 3 012 059 A2 | 4/2016 | | |
| JP | 2006-8476 A | 1/2006 | | |
| JP | 2013-203629 A | 10/2013 | | |
| WO | WO-2014058748 A1 * | 4/2014 | | C03C 15/00 |
| WO | WO-2015164241 A1 * | 10/2015 | | B23K 26/0869 |

\* cited by examiner

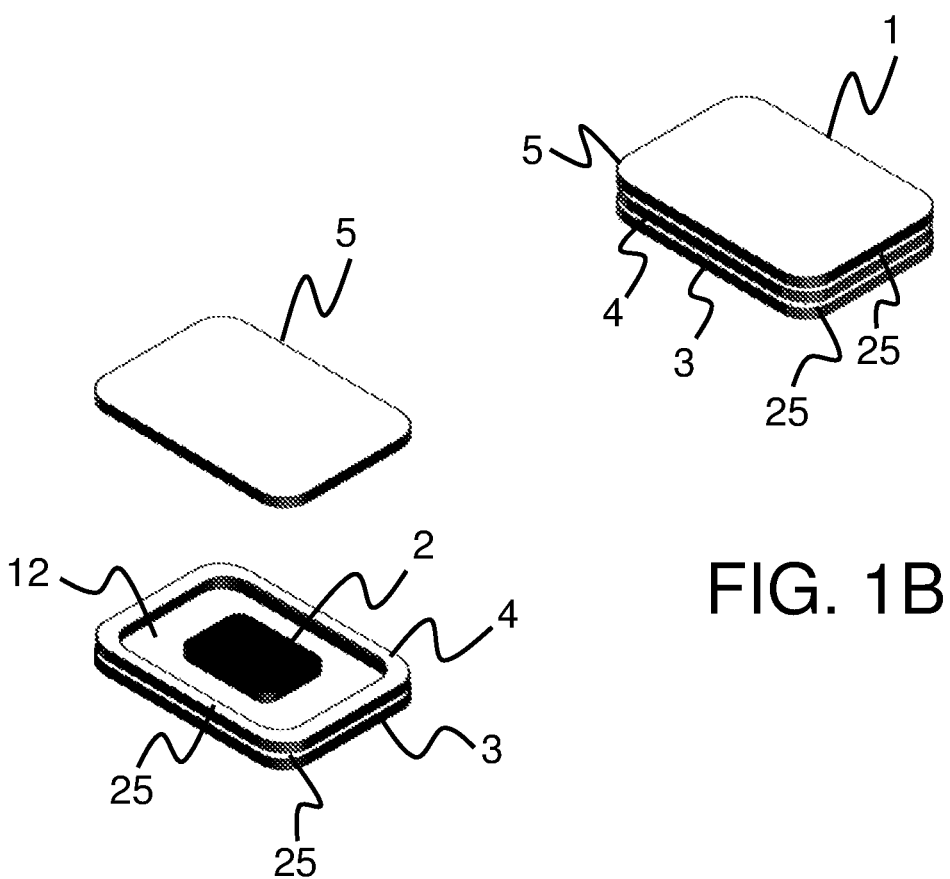

| A | Aligning the wafer and the components to be accommodated | Low temperature |
| B | Superimposed wafer stack | Low temperature |
| C | Laser welding the accommodation cavities | Low temperature |
| D | Separating the wafer / dicing the packages | Low temperature |
| E | Hermetically sealed, toughened package | Normal temperature |

Bottom and top cover under strain

Interposer/Compound under pressure

HERMETICALLY SEALED TRANSPARENT CAVITY AND PACKAGE FOR SAME

CROSS REFERENCE TO RELATED APPLICATIONS

This is a continuation of International Patent Application No. PCT/EP2020/070934 filed on Jul. 24, 2020, which is incorporated in its entirety herein by reference. International Patent Application No. PCT/EP2020/070934 claims the priority of German Patent Application No. DE 10 2019 119 961.1 filed on Jul. 24, 2019, which is incorporated in its entirety herein by reference.

BACKGROUND OF THE INVENTION

1. Field of the Invention

The invention relates to a method for providing a plurality of hermetically sealed packages, and to a transparent package.

2. Description of the Related Art

Hermetically sealed packages, which may also be referred to as enclosures, encapsulations, or housings, can be used to protect sensitive electronics, circuits, or sensors, for example. They allow to apply medical implants, for example in the area of the heart, in the retina, or for bio-processors. Bio-processors made from titanium have been known and are being employed.

Sensors can be protected against particularly adverse environmental conditions by a package according to the invention. This field also includes MEMSs (micro-electromechanical systems), barometers, and the like, for example.

Another field of application for a package according to the invention can be found in a case for a smartphone, in the field of virtual reality glasses and similar devices. A package according to the invention may also be used for the production of flow batteries, for example in the context of electromobility. However, packages according to the invention can also find application in aerospace, in high-temperature applications, and in the field of micro-optics.

The aforementioned intended purposes have in common that the electronics are subject to high requirements with regard to their robustness. Therefore, the electronics have to be protected against environmental influences. Furthermore, there may be the requirement of ensuring an exchange with the interior of the package, i.e. with the cavity defined by the package. The package is at least partially transparent, i.e. at least in sections thereof and/or at least for some range of wavelengths. This transparency allows for communication, data or power transfer, measurements of and with the electronics or sensors disposed in the cavity. In particular optical communication techniques or optical data and power transfer can be possible.

In principle, it has been known to join a plurality of parts and to arrange these parts such that an accommodation area is created in an intermediate space, which can accommodate components. For example, European patent EP 3 012 059 B1 discloses a method for producing a transparent piece for protecting an optical component. A novel laser process is used for this purpose.

What is needed in the art is a way to improve packages and in particular make them more resistant, thereby allowing enhancement of the robustness against environmental impacts and also mechanical stress, for example.

SUMMARY OF THE INVENTION

In some exemplary embodiments provided according to the invention, a hermetically sealed package includes: at least one cover substrate and a substrate arranged so as to adjoin the at least one cover substrate, which together define at least part of the package, the at least one cover substrate being in a thermally prestressed state and bonded to the substrate adjoining the at least one cover substrate in a hermetically sealing manner by at least one laser bonding line, the at least one cover substrate being made of a material which has a different characteristic value of a coefficient of thermal expansion (CTE) than the adjoining substrate and a thermal prestress is established in the package; and at least one functional area enclosed in the package.

In some exemplary embodiments provided according to the invention, an arrangement for producing a package includes: a first substrate made of at least partially transparent material; and a second substrate arranged immediately adjoining the first substrate, the first substrate being joined to the second substrate by a laser welding process at a bonding temperature. A compressive stress towards the second substrate is established in the first substrate at a temperature below the bonding temperature or a compressive stress towards the second substrate is established in the first substrate at a temperature above the bonding temperature.

In some exemplary embodiments, a method for providing a plurality of hermetically sealed packages is provided. Each package accommodates a functional area or defines a cavity that is enclosed by a laterally circumferential edge, a bottom, and an upper side of the package, and the cavities are in the form of accommodation cavities for receiving electronic circuits, sensors, or micro-electromechanical systems. The method includes: providing a first substrate and at least one second substrate, the at least one second substrate being made of transparent material and being a transparent substrate, and the at least one second substrate having a characteristic value of a coefficient of thermal expansion (CTE) which differs from a characteristic value of a coefficient of thermal expansion (CTE) of the first substrate; arranging the first substrate and the at least one second substrate so as to directly adjoin each other or on top of one another, with the at least one second substrate defining a respective edge of a respective package of the cavities to be sealed, the first substrate defining a respective bottom of the respective package, and a contact area is defined at contact surfaces between the first substrate and the at least one second substrate so that each package includes at least one contact area; sealing the cavities in a hermetically tight manner by bonding the first substrate and the at least one second substrate along the at least one contact area of each package; and dicing the respective package by a cutting step or a separation step.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1A is a view of an opened accommodation cavity from above;

FIG. 1B is a perspective view of a sealed package;

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 2A:
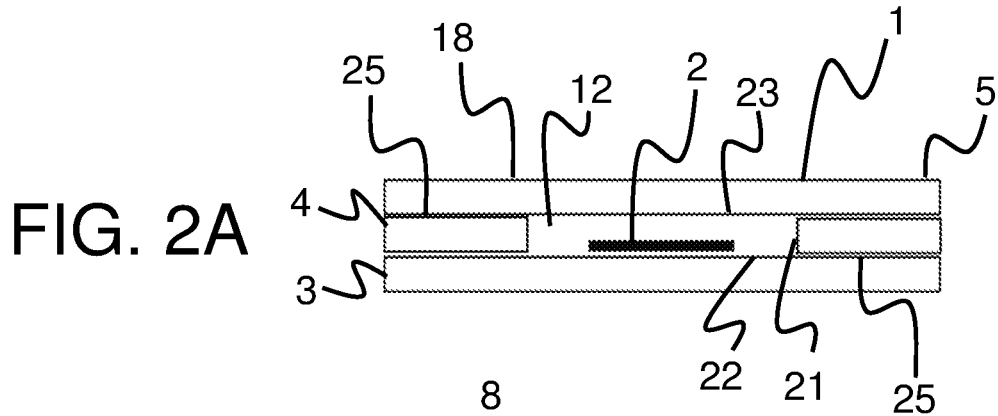
FIG. 2A is a sectional view through the package.

Exemplary embodiments provided according to the invention provide an improved package for a cavity in order to withstand even more adverse environmental conditions and impacts. Particular attention is paid to the mechanical stress on the package, for example to avoid fractures at the edges.

Another aspect of the present invention consists in providing the enhancement of the package in a particularly cost-effective way, but also reliably and durably, since the enhanced package also has to assert itself in the competitive situation on the market.

Therefore, in the context of the invention, a method is presented for providing a plurality of hermetically sealed packages. Although the method could be modified without difficulty so as to produce only a single package by this method, it makes sense under economic considerations to produce a plurality of packages in one and the same process sequence. This saves time, effort, and raw material.

A hermetically sealed package provided according to the invention comprises at least one cover substrate and a substrate arranged so as to adjoin the cover substrate, which together form at least part of the package. The at least two substrates may be arranged one above the other, i.e. stacked.

According to the invention, the package encloses a functional area. At least the cover substrate may comprise a vitreous, i.e. glassy material. The cover substrate is thermally prestressed and is bonded to the substrate adjoining the cover substrate in a hermetically sealing manner, by at least one laser bonding line.

The cover substrate is made of a material which has a different characteristic value of the coefficient of thermal expansion (CTE) than the adjoining substrate, whereby a thermal prestress is established in the package.

The package may be adapted such that the thermal prestress exerts a compressive stress on the cover substrate. Furthermore, the at least one laser bonding line may circumferentially enclose the functional area at a distance DF therefrom, so that the functional area is enclosed on all sides thereof.

The adjoining substrate may be a base substrate. In this case, the base substrate and the cover substrate can be bonded to one another in a hermetically sealing manner by a common laser bonding line. On the other hand, the adjoining substrate may be an intermediate substrate which is disposed, i.e. sandwiched between the cover substrate and the base substrate, and in this case the base substrate is joined to the intermediate substrate in a first bonding plane and the cover substrate is joined to the intermediate substrate in a second bonding plane.

The at least one intermediate part, i.e. the intermediate substrate, may have a higher characteristic value of the coefficient of thermal expansion (CTE) both in comparison to the cover substrate and in comparison to the base substrate. The thermal prestress may be established by using materials that have different coefficients of thermal expansion as well as by a suitable temperature. The method provided according to the invention differs from the prior art, such as from US 2017/210662, by moderate temperatures and by including a functional element. The U.S. document also uses a combination of different coefficients of thermal expansion with suitable temperature coating, but in a hot forming process and for the toughening of glass wafers that do not have a cavity for a functional element.

The functional area may comprise a hermetically sealed accommodation cavity for receiving an accommodation item, such as an electronic circuit, a sensor, or a microelectromechanical system (MEMS). The cover substrate may define an upper side of the accommodation cavity, the intermediate substrate defines a lateral circumferential edge of the accommodation cavity, and the base substrate defines a bottom of the accommodation cavity, which together completely enclose the accommodation cavity. Furthermore, at least one of the lateral circumferential edge, the bottom, and the upper side may be transparent for some range of wavelengths, at least in sections thereof.

According to the invention, each package defines a cavity which is enclosed by a lateral circumferential edge, a bottom, and an upper side of the package. In other words, the cavity is enclosed by the package all around, so that the package forms the circumferential edge, the bottom, and the upper side for the cavity.

For the purposes of the present application, bottom and upper side is a geometrical construct which may also be any other side with regard to the final orientation of the package. Alternatively, the upper side may be described as a first side, the bottom side as a second side opposite the first side, and the edge as the intermediate area between the first and second sides, with the edge typically extending substantially perpendicular to the first and/or second sides. However, in order to facilitate the comprehension of the invention and to approximate the invention to a typical description, terms as upper side, lower side, and circumferential edge will be used below, as explained.

The upper side of the cavity can then be defined by a top layer such as a substrate, wafer or sheet. Furthermore, the circumferential edge of the cavity may be formed by a second or intermediate substrate, wafer or sheet, the second substrate having a hole, which hole represents the later cavity. The bottom of the cavity can finally be defined by a lower layer, substrate, wafer, or sheet by arranging the lower layer below the intermediate layer.

The cavities are in particular in the form of accommodation cavities, which means that electronic circuits, sensors, or MEMSs can be integrated in the respective cavities, for example. These aforementioned devices such as in particular electronic circuits, sensors, or MEMS will therefore be enclosed by the package all around, i.e. on all sides, since they are arranged within the accommodation cavity.

The method provided according to the invention for providing a plurality of hermetically sealed packages comprises a first step of providing a first and at least one second substrate, the at least one second substrate being made of transparent material and being a transparent substrate, and the at least one second substrate has a characteristic value of the coefficient of thermal expansion (CTE) which differs from the characteristic value of the coefficient of thermal expansion of the first substrate. The at least two substrates are arranged so as to directly adjoin each other or on top of one another, the at least one second substrate defining the respective edge of the respective package of the cavities to be sealed, the first substrate defining the respective bottom of the respective package. At least one contact area or interface is defined between the at least two substrates, so that each package has at least one contact area. The cavities are then hermetically sealed by bonding the at least two substrates along the contact area(s) of each package, in particular in the contact area along a line at the edge of each package. Finally, the respective package is diced by a cutting or separation step.

In some embodiments of the method provided according to the invention, initially a first, at least one intermediate, and a third substrate are provided, the at least one intermediate substrate may be made of transparent material and be a transparent substrate, and with the at least one intermediate substrate having a different characteristic value of the coefficient of thermal expansion (CTE) than the first and/or than the third substrate.

The at least three substrates are arranged so as to directly adjoin each other, or on top of one another. In other words, the at least two substrates are arranged or attached to one another such that they make surface contact to one another without having other layers between the at least two substrates. For technical reasons, there might be minor gas inclusions between the substrate layers, which cannot be avoided and which may be a result of possible unevenness of the substrate layers. The amount of gas trapped between the two substrate layers making surface contact, i.e. in particular in the contact area, can be further reduced by increasing the pressure, for example, such as in particular by pressing the at least two substrates against each other, or by a surface treatment of the substrate layers such as a grinding process. Prior evacuation is beneficial. Filling with a type of gas or else with a liquid may also be advantageous, depending on the process parameters and the materials to be employed.

Thus, the substrate layers are stacked directly and in direct contact to each other, i.e. arranged so as to adjoin each other. Foreign materials are excluded as far as possible between the substrate layers, so that the most cohesive surface contact possible is created between one substrate layer and the adjoining substrate layer. In the case of two substrates, for example, the base substrate is arranged in direct contact to the cover substrate, in particular without any other materials or any spacing between the base substrate and the cover substrate. In the example of more than two substrates, the base substrate is arranged directly adjoining the one or the first one of the intermediate substrate layer(s), the cover substrate in turn is arranged directly adjoining the one or the last one of intermediate substrate layer(s).

Then, the substrates are joined together using the novel laser welding process. In this case, a planar substrate layer is directly joined or bonded to the immediately adjoining planar substrate layer without providing or requiring any foreign material or non-planar material or intermediate material layers for this purpose. That is, the substrates are bonded directly to one another. The laser bonding line introduced into the two-dimensional contact area between two substrate layers bonds the directly adjoining substrate layers to one another in a non-releasable manner. The fused zone of the laser bonding line is therefore present in both substrates and seamlessly extends from the first substrate into the immediately adjoining second substrate, that is, for example, from the base substrate into the cover substrate if the cover substrate is arranged adjoining the base substrate.

Thus, a direct two-dimensional or even full-surface transition is formed from one substrate layer to the next substrate layer, i.e. a substrate-to-substrate transition or a glass-to-glass transition, for example. A locally limited volume in the form of a welding zone or laser bonding line is created, which includes material transferred or mixed between the adjoining substrate layers which in particular have a sheet-like shape. In other words, material of the first substrate, for example the cover substrate, penetrates into the adjoining substrate, for example the intermediate substrate or the base substrate, and vice versa, i.e. material from the adjoining substrate penetrates into the first substrate, so that the welding zone includes a complete mixture of material from the adjoining substrates.

The novel laser welding technique for producing the non-releasable substrate-to-substrate transition may be free of intermediate layers, glass frits, foils, or adhesives that had to be introduced between the substrates in earlier prior art processes. Rather, the non-releasable bond can be produced without such interfering intermediate layers or additional materials. This saves the use of additional materials, increases the achievable strength of the end product, and enables reliable hermetic sealing of the functional area or of the cavity/cavities.

In some embodiments, a gap that might arise between the substrates has a width of less than or equal to 5 µm, for example less than or equal to 1 µm. Such a gap arises, for example, due to tolerances in the substrate manufacturing, by thermal impacts or by inclusions of particles such as dust. Even with such a tolerable spacing which is still considered to be immediately adjoining in the context of the present invention, it is possible to laser weld in such a manner that the welding zone is between 10 to 50 µm in thickness so that a hermetic seal is ensured. Again, in this case, the welding zone extends from the first substrate into the second substrate adjoining the first substrate. Thus, the welding zone is introduced in the contact area between the first and second substrates and directly fuses the substrates to one another to form an inseparable bond. In other words, when the adjoining substrates are bonded in the welding zone, material of both substrates is directly melted in the welding zone, and the material of the first substrate mixes with the material of the second substrate to form an inseparable integral bond. The package produced in this way therefore comprises an integral, i.e. monolithic bond between the substrates in the welding zone.

The at least one intermediate substrate defines the respective edge of the respective package for the cavities to be sealed. The two remaining substrates define the respective bottom and the respective upper side of the respective cavities. A respective contact area or interface is formed between the at least two, for example three, substrates, so that each package includes at least one, for example two, contact areas. A contact area may extend over the entire surface of the respective substrate. Each package has at least two contact surfaces associated therewith. This means, even if the transparent substrate, viewed as a whole, defines a common contact area which extends over the entire surface of the substrate and which adjoins the second substrate, this contact area is conceptually divided, i.e. subdivided for each respective package, so that each package has a part of this interface associated therewith.

An interface does not have to be optically transparent. It may also be advantageous if the transparent substrate is opaque in the visible wavelength range. Only the substrate through which the laser passes to reach the contact area has at least one spectral window such that at least the wavelength of the employed laser can be transmitted through the substrate at least partially or at least in sections thereof. The contact area is adapted such that the laser is able to deposit energy there. The surfaces of the two adjoining substrates may, for example, be joined by optical contact bonding and may furthermore exhibit a roughness in the nanometer range, for example. The laser radiation will at least partially be absorbed at this interface, so that the laser energy can be introduced there. In the sense of the present application, contact area is generally understood to mean an interface at which the incident laser beam can deposit energy so that a bonding or welding process can be performed along the contact area. A simple case of such an interface is the contact area between two substrates adjoining each other.

In some embodiments, all three substrate layers are transparent, such that the bottom, the edge, and the upper side and hence the package are entirely made of transparent material.

The substrates are bonded or joined to one another in order to form a joint package and to hermetically seal the cavities.

The step of hermetically sealing the cavities can be carried out by bonding the at least three substrates along the two contact areas of each package by a laser welding process. In other words, a laser can be used to deposit energy in the contact area, in particular locally limited to such an extent that it can be referred to as a cold welding process. That is, the thermal energy provided for the bonding is focused to the extension of the interface and only comparatively slowly diffuses into the rest of the material of the package, so that in particular no significant temperature rise will occur inside the cavity. This protects the electronics disposed in the cavity from overheating.

The laser is used to locally melt material of the two substrates along the interfaces in the area of the respective package, so that the at least two substrates are bonded locally. For this purpose, a person skilled in the art may refer to EP 3 012 059 B1, for example, which is hereby incorporated by reference. When using at least two transparent substrates, one to define the edge and a second one to define the upper sides, each package will have two circumferential contact areas associated therewith. In this case, the respective cavity may be hermetically sealed by bonding along the two contact areas using the laser welding process. Thereby, the intermediate and the third substrate, each one being transparent, as well as the first substrate are firmly welded together, and the cavities are hermetically sealed.

The respective package is diced or singulated by a cutting or separation step. This means that the substrates are cut or separated such that each package is diced from the rest of the material.

In some embodiments, the at least one intermediate substrate may comprise more than one transparent substrate, which together define the respective edge of the cavities. For example, three intermediate substrate layers may be arranged between the first and third substrates, and these three intermediate substrate layers will jointly define the edge of the cavities.

The at least three substrates may be provided in the form of a wafer stack comprising at least three wafers. In this case, a plurality of hermetically sealed packages can be jointly produced from the wafers or the wafer stack in one and the same fabrication process. This procedure has proven to be particularly cost-efficient, since it implies particularly little scrap and thus material loss.

The at least three wafers may be made of glass, glass ceramics, silicon, sapphire, or a combination of the aforementioned materials. Alternatively, at least one wafer is made of a material that differs from that of the intermediate wafer. The wafer defining the bottom of the cavities may be provided in the form of an optically non-transparent material which may optionally have other properties, such as in particular electrical conductivity. However, the lateral edge and the upper side of the packages may be made of transparent material. In some embodiments, all substrates are provided based on transparent material. A possible advantage of a transparent package made of glass or predominantly made of glass, in particular borosilicate glass, is its chemical inertness.

The one or more substrate(s) may also have a coating. For example, AR coatings, protective coatings, bioactive films, optical filters, conductive layers such as made of ITO or gold may be employed, as long as it is ensured that at least partial transparency for the employed laser wavelength is provided in the irradiation area of the laser.

The edge strength of the hermetically sealed package can be measured using a four-point bending test technique. The edge strength of the packages as enhanced by the method provided according to the invention is at least 150 MPa or even more than 150 MPa, which are therefore particularly resistant.

The dicing of the respective package may be accomplished using a laser, i.e. by a laser cutting or laser separation process. This allows more clean separation of the packages from one another, with fewer breakage and cleaner separating points. The same laser that is used for the welding step can also be used for the separation.

The at least one transparent substrate may be made of glass, glass ceramics, or silicon, or sapphire, or a combination of the aforementioned materials, i.e., for example, glass/silicon, a glass/silicon/sapphire combination, or a silicon/sapphire combination. The one or more further substrate(s) may also comprise or consist of $Al_2O_3$, sapphire, $Si_3N_4$, or AlN. Combining a transparent substrate with a different type of substrate allows obtaining semiconductor properties, for example. Coatings may also be employed, e.g. piezoresistive Si layers, in particular for pressure sensors, or thicker layers for micro-mechanical applications such as pulse measurement via an MEMS.

The first and/or third substrate(s) may have a thickness of less than 500 µm, for example less than 300 µm, less than 120 µm, or a thickness of less than 80 µm.

In this case, at least one of the lateral circumferential edge, the bottom, or the upper side are transparent for a range of wavelengths, at least in sections thereof. In other words, it is sufficient if at least one component of the package is transparent for a wavelength range at least in a portion of the component, and the wavelength range is known in advance and the material can accordingly be adapted to the wavelength of the laser to be used, if desired.

The package is welded using a laser welding process to form the hermetically sealed package. In other words, the edge, bottom, and top consist of more than one piece, for example of two or three parts or even more, and the parts are laser-welded to one another to complete the package.

In some embodiments, the package may be chemically toughened at least partially and/or in sections thereof. For example, one surface of the package is chemically toughened, i.e. for example the upper side. It is also possible that the upper side and the edge are chemically toughened. In some embodiments, the upper side and the edge and the lower side are chemically toughened, so that the respective surface of the upper side and the lower side as well as the respective edge, i.e. the rim, is chemically toughened.

Prior to performing the laser welding process, the packages may be heated to a temperature that is higher than the temperature during later use of the packages. For example, the packages are heated to a temperature above ambient temperature prior to performing the laser welding process.

More particularly, the heating prior to the laser welding is conducted to a temperature that is higher than the temperature during subsequent use by 5 K, higher by 10 K, by 20 K, or higher by 70 K. Subsequently, the packages are allowed to cool to ambient temperature.

In some embodiments, the step of dicing the packages is performed prior to the step of allowing the packages to cool down to ambient temperature.

It will be apparent to a person skilled in the art that the assembly may also be implemented with the inverse relationship in terms of the coefficient of thermal expansion. If the at least one intermediate substrate has a lower value of the coefficient of thermal expansion than the top and/or the bottom and at the same time the laser welding process is performed at a lower bonding temperature, i.e. a bonding temperature below the temperature during later use of the package or below the ambient temperature, then a reverse pressure distribution will be established, which similarly causes a strengthening of the package. In this case, a tensile stress will build up in the top and/or bottom at the operating temperature of the package, whereas a compressive stress will build up in the at least one intermediate substrate.

According to the invention, a package is furthermore provided, which includes a hermetically sealed accommodation cavity enclosed therein, which is produced according to a method as described previously.

A package produced according to the method described previously may be used as a medical implant or as a sensor, in particular as a barometer.

Also within the scope of the invention is a transparent package with a hermetically sealed accommodation cavity for receiving an accommodation item. An accommodation item is an electronic circuit, a sensor, or an MEMS, for example.

The transparent package provided according to the invention has a laterally circumferential edge made of transparent material provided by a first part, and a bottom provided by a second part, and an upper side provided by a third part, which together completely enclose the accommodation cavity all around.

According to the invention, the at least one intermediate part of the package is made of a material which has a different characteristic value of the coefficient of thermal expansion (CTE) than the first and/or third substrate(s).

Moreover, the three parts are thermally prestressed. Additionally, the three parts may be chemically toughened.

Finally, the at least three parts of the package are joined to form the hermetically sealed package using a laser welding process.

The transparent package may have an edge strength of at least 150 MPa or more than 150 MPa, which edge strength can be measure using a four-point bending test technique.

Prior to the step of welding together the at least two, for example three, substrates, the substrates may be at least temporarily bonded to one another along the contact surfaces of each package by optical contact bonding.

The transparent package may, for example, have a size of 3 mm×3 mm or less, in particular the accommodation cavity has a diameter of less than or equal to 2 mm. For example, a transparent package may also have a size of 0.2 mm×0.2 mm or less. On the other hand, the transparent package may also be made larger, depending on the area of application, with several centimeters in length and more being possible. For practical reasons, governed by the fabrication method, which should however not be understood as a size limitation per se, a size limit is simply given by the size of the wafers to be cut. However, the use of wafers for the fabrication is considered to be only one example. For example, it is entirely possible to use glass sheets which can also have larger dimensions than typical wafer dimensions, for producing the transparent package.

A marker may be incorporated in the first, second, and/or third parts.

The thermal toughening can be achieved by selectively employing materials that have different thermal expansion coefficients. This is further promoted or achieved by an appropriate temperature.

Furthermore, it comes within the scope of the invention to provide an arrangement which is particularly suitable for producing a package. The arrangement provided according to the invention comprises a first substrate made of at least partially transparent material, a second substrate which is arranged immediately adjoining the first substrate, and the first substrate is joined to the second substrate by a laser welding process at a bonding temperature, whereby a compressive stress towards the second substrate is established in the first substrate at a temperature below the bonding temperature; or whereby a compressive stress towards the second substrate is established in the first substrate at a temperature above the bonding temperature.

The second substrate in the arrangement may be made of a material which has a different characteristic value of the coefficient of thermal expansion (CTE). More particularly, the second substrate has a higher coefficient of thermal expansion.

The first substrate in the arrangement may be a glass or glass ceramic substrate.

Furthermore, a tensile stress may be established in the second substrate of the arrangement.

Figure 7:
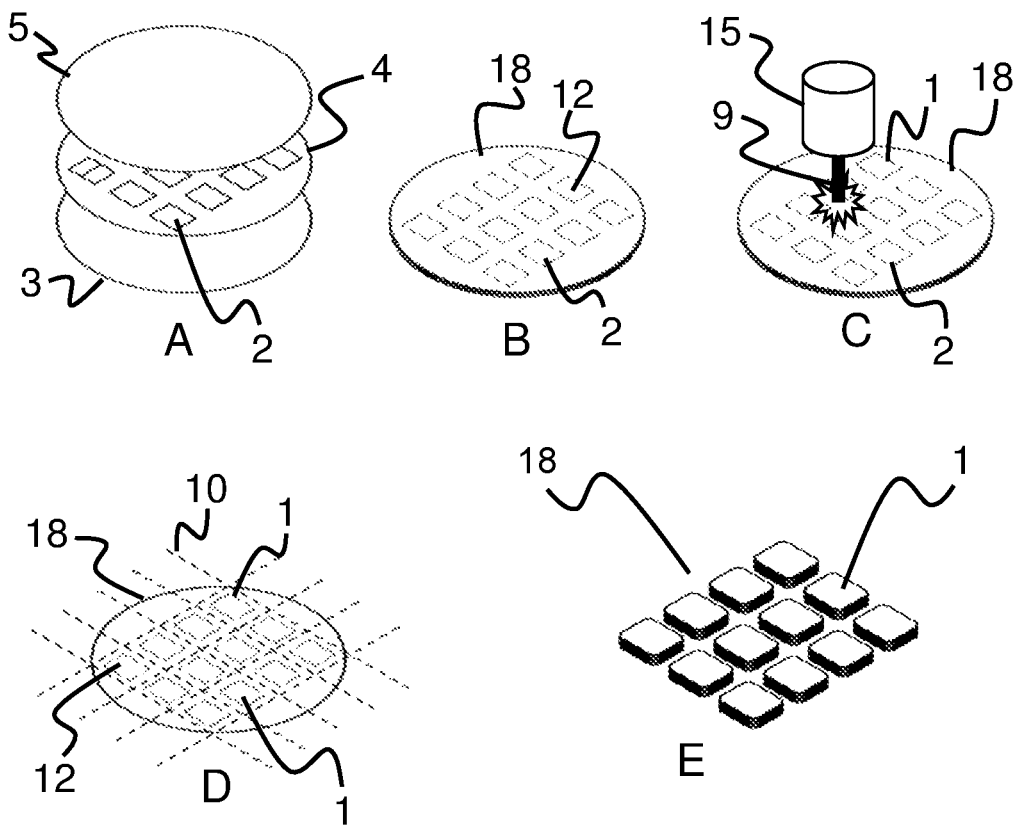
FIG. 7 illustrates a method for producing a package.

Referring now to the drawings, FIG. 1A shows the accommodation item 2 to be protected, embedded on a lower substrate 3, surrounded by an intermediate substrate 4 and to be covered by an upper substrate 5. Thus, the three substrates 3, 4, 5 jointly define the package 1 around the accommodation item 2, which is disposed in the cavity 12. In other words, when the upper substrate 5 is placed on the intermediate substrate 4 in the example of FIG. 1A, a closed accommodation cavity 12 is formed, which will have to be hermetically sealed in subsequent steps. Here, the intermediate substrate 4 is made of a different material than the lower substrate 3 and than the upper substrate 5. In the example presented here, the intermediate substrate 4 has a higher characteristic value of the coefficient of thermal expansion CTE than the other layers shown. The illustrated layers 3, 4, 5 can be wafer discs, so that the package is formed by stacking three wafer discs on top of one another to form a wafer stack and by joining or welding them together. A substrate 3, 4, 5 may be a planar or sheet-like glass component forming part of a separated die. Wafer refers to a, for example, large glass component that can be separated or diced into dies or chips, which then comprise a plurality of substrates. Subsequent dicing as shown in FIG. 7 permits to cost-effective manufacturing of a plurality of components consisting of a plurality of substrates.

FIG. 1B shows the hermetically sealed and toughened package 1 formed in this way. This package 1 comprises the lower substrate 3, the intermediate substrate 4, and the upper substrate 5 stacked on top of one another, with a respective interface 25 as defined between the lower substrate 3 and the intermediate substrate 4 on the one hand, and between the intermediate substrate 4 and the upper substrate 5 on the other hand. As can furthermore be seen from FIG. 1A, the intermediate substrate layer 4 is not a continuous layer, rather the accommodation cavities 12 are defined at the level of the intermediate substrate layer.

Reference is now made to FIG. 2A, which shows a sectional view through a hermetically sealed, toughened package 1. The lower substrate 3 defines the bottom 22 of the cavity 12, the intermediate substrate 4 defines the edge 21 of the cavity 12 and has a coefficient of thermal expansion CTE that is different from that of substrates 3 and 4 in this example, and an upper substrate 5 finally defines the upper side 23 of the cavity 12. In other words, the lower substrate, the intermediate substrate, and the upper substrate 3, 4, 5 in the form of a substrate stack 18 jointly enclose the accommodation cavity 12. The accommodation item 2 is disposed in the cavity 12. The substrates 3, 4, 5 may again be wafer discs, so that the package is jointly defined by three wafers in the form of a wafer stack 18 enclosing the accommodation cavity 12 and forming the package 1.

Figure 2B:
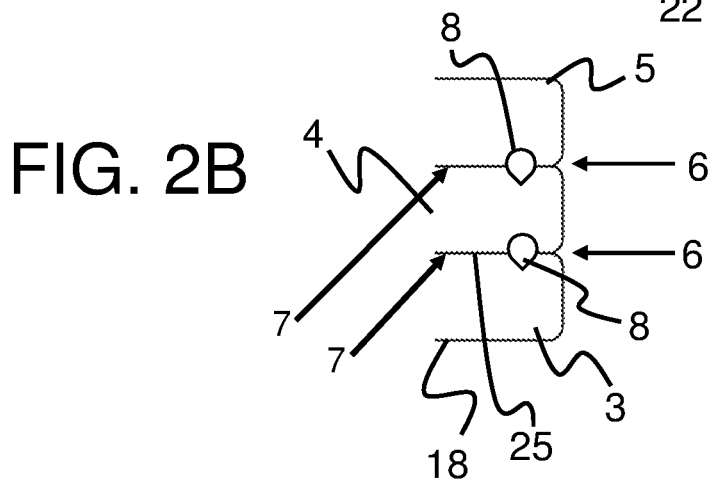
FIG. 2B is a detailed view of a welding zone.

FIG. 2B shows a detail of the joining area, clearly illustrating the laser-bonded interface zone 7 and the laser welding zone 8. Laser welding zone 8 is located in contact area or interface 25. Environmental influences can act on the package 1 from outside, in particular at corners 6 of the laser-welded stack 18. These corners 6 prevent chemical solutions, for example, from penetrating into the substrate stack 18 as far as to the laser welding zone 8.

Figure 2C:
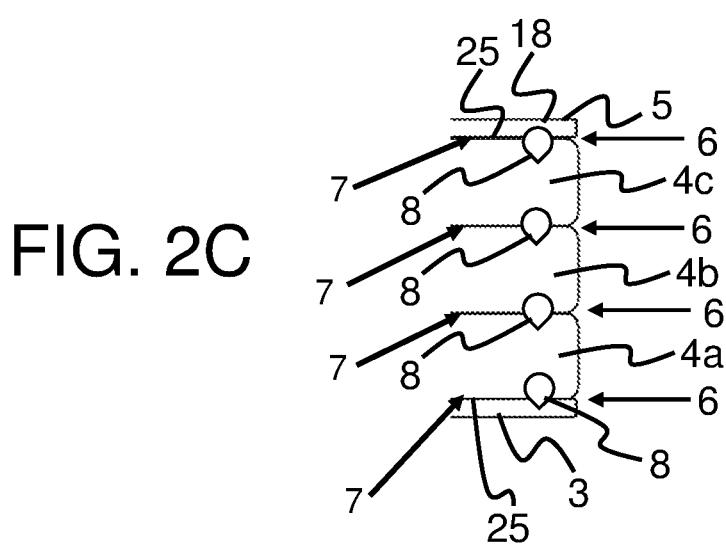
FIG. 2C illustrates an exemplary embodiment of the package comprising three intermediate layers.

FIG. 2C shows a detailed sectional view of a further embodiment of the substrate stack 18 or the package 1, comprising three intermediate layers 4a, 4b, and 4c disposed above a lower layer 3. The three intermediate layers 4a, 4b, 4c all have a different characteristic value of the coefficient of thermal expansion, CTE, than the lower layer 3 and also than the upper layer 5. This embodiment allows achieving a graduated stress profile across the layers 4a, 4b, 4c, or to provide non-laser-welded components with glass layers under pressure.

Figure 3:
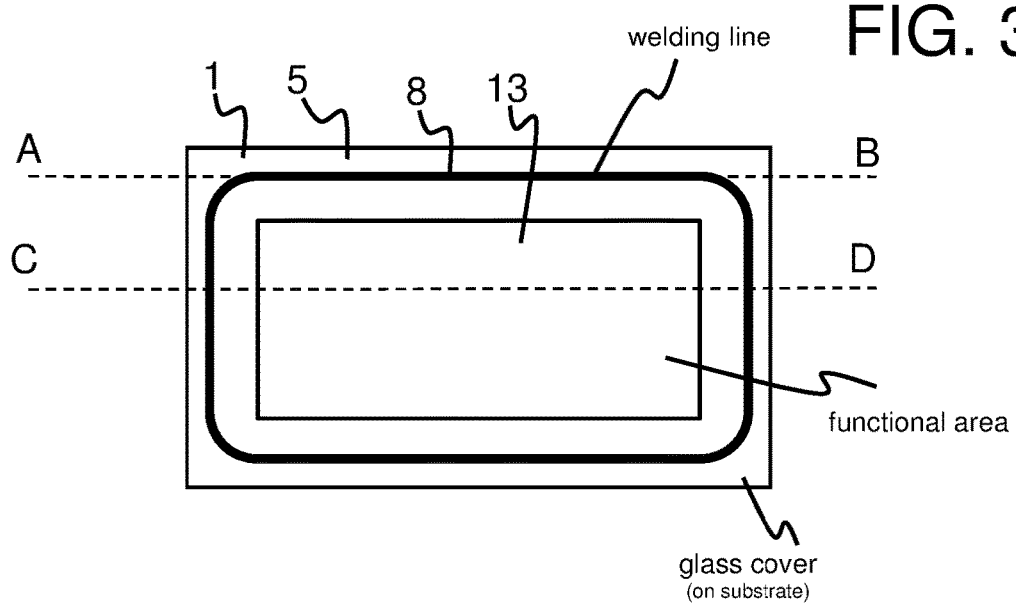
FIG. 3 illustrates a plan view of a further exemplary embodiment of a package.

FIG. 3 shows a plan view of a package 1 provided according to the invention, with the circumferential laser welding zone 8 surrounding the functional area 13. Functional area 13 may be implemented in different ways. Exemplary embodiments of functional area 13 as well as for other options of a package can be seen in FIGS. 4A through 8B. The various designs of functional area 13 can all be schematically illustrated as in FIG. 3, as they will be similar in such a plan view. Lines A-B and C-D indicate section lines along which the sectional views of FIGS. 4A to 8B are reproduced.

The functional area may implement various tasks, for example it may include an optical receiver or a technical, electro-mechanical, and/or electronic component which is disposed in the functional area 13. It is also possible to implement a plurality of such tasks in the functional area 13. On the upper side, the package 1 is covered by upper substrate 5. The laser welding zone 8 extends into this upper substrate 5.

Figure 4A:
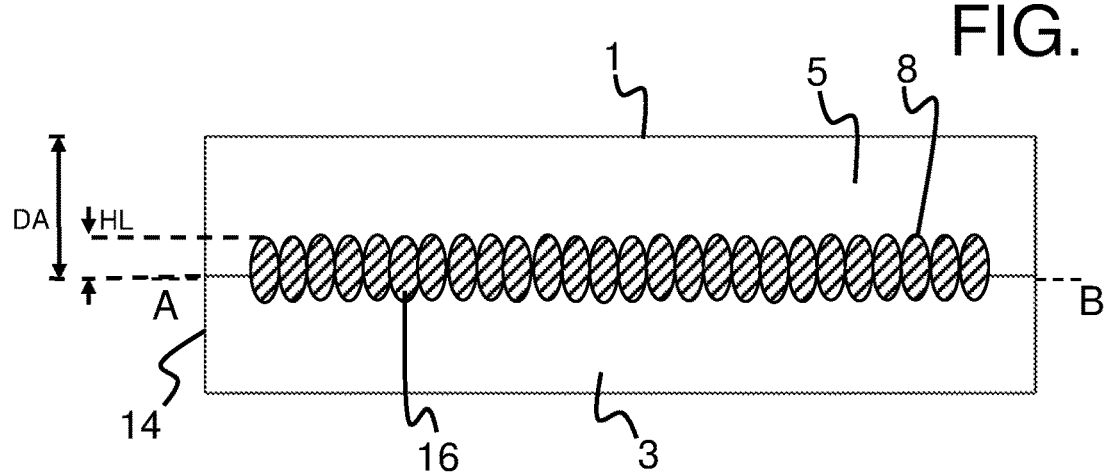
FIGS. 4A-6 are sectional views along lines A-B and C-D of embodiments of a package as illustrated in FIG. 3.

Referring to FIG. 4A, which shows a first sectional view of an exemplary embodiment of a package 1, which comprises the base substrate 3 and the cover substrate 5. In other words, the package consists of or is composed of two layers, namely base layer 3 and cover layer 5. FIG. 4A also shows the structure of laser welding line 8 in the form of a string of multiple laser pulse impact areas 16 which are placed so close to one another that the material of the base substrate 3 and of the cover substrate 5 seamlessly fuses to one another.

Figure 4B:
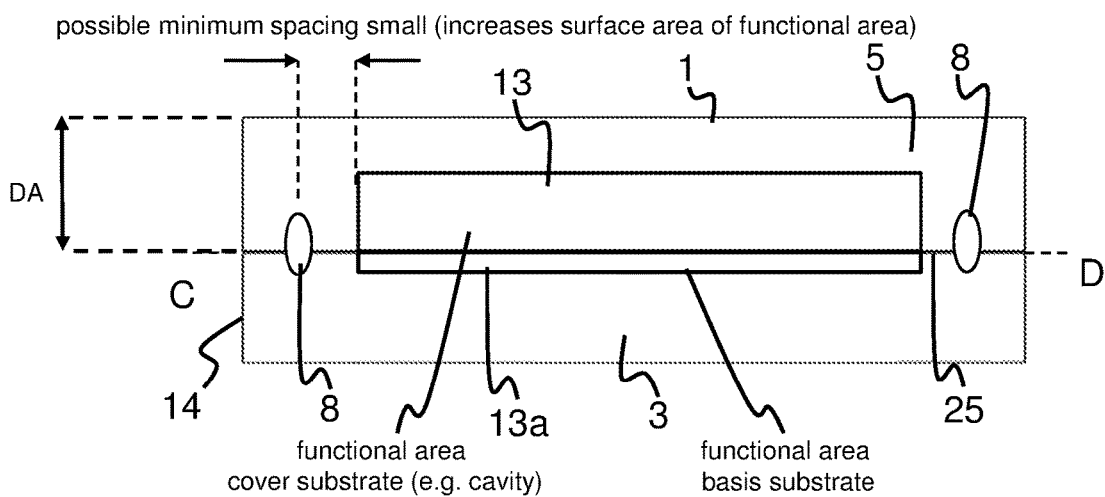

FIG. 4B shows a sectional view of an exemplary embodiment of a package 1 taken along line C-D as indicated in FIG. 3. Cover substrate 5 has a first toughened layer 27 at its upper or outer surface, which extends over a thickness DoL into the material of the cover substrate 5. In other words, cover substrate 5 and thus the package 1 is toughened at its upper surface, i.e. has a toughened zone 27 there, so that the package 1 is toughened in sections thereof, namely on one side.

FIG. 4B furthermore shows a section through the functional area 13, 13a which extends inside the package 1, for example as a continuous cavity or hollow space. In other words, the cavity extends from base substrate 3 into the cover substrate 5 and, for example, is in the form of a recess made in the base substrate 3 and/or in the cover substrate 5. For example, the functional area 13a may also comprise an active layer such as an electrically conductive layer, and the functional area 13 comprises the cavity. The laser welding zone 8 provided circumferentially around the functional area 13, 13a seals the functional area 13, 13a all around along the lateral sides thereof. It is conceivable to leave gaps in the laser welding zone 8 so that the functional area 13, 13a will not be sealed all around, for example in order to keep open a communication channel which can be used to establish fluid communication with the environment, for example. In other words, it might be contemplated to not seal predefined locations or points using the focused laser beam 9, but to rather achieve a hermetic seal by other means there, such as by an adhesive. In some embodiments, the functional area 13, 13a is sealed along all of its sides and without any gaps.

Figure 5A:
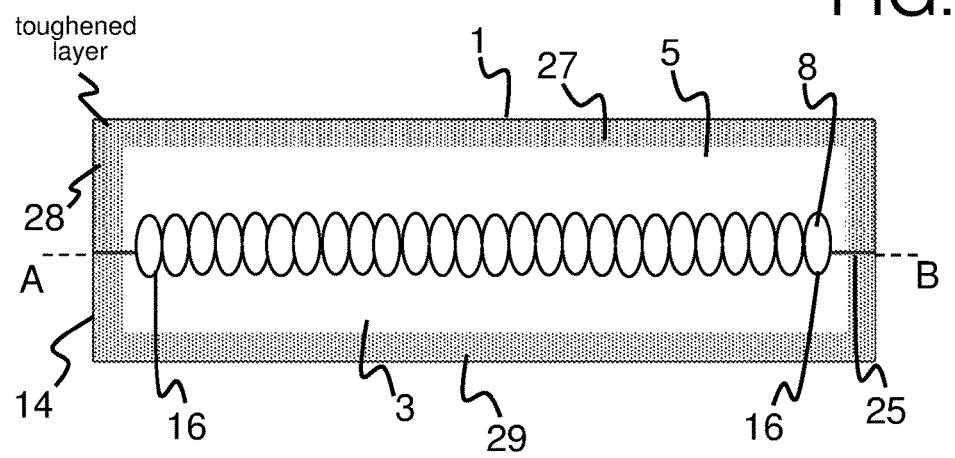

Reference is now made to FIG. 5A, which shows a further exemplary embodiment in which incident laser pulses 16 create the laser welding zone 8 where the cover substrate 5 is welded or joined to the base substrate 3 along contact area 25. This embodiment has the further special feature to have the surfaces of the first substrate 3 and of the second substrate 5 toughened all around, that is to have toughened layers 27, 28, and 29.

For example, the cover substrate 5 can be dipped into a toughening bath with its upper side before being bonded to the base substrate 3, or else after having been bonded to the base substrate 3, so that the finished package 1 will be chemically toughened, i.e. will have at least one toughened surface 27 and/or has at least one toughened layer. In other words, the finished package 1 is toughened at least partially or at least in sections thereof, in particular chemically toughened. With the chemical toughening, a compressive stress is established on the cover substrate 5. The first toughened layer 27 has the height DoL. The welding zone 8 has the height HL. A minimum material thickness MM remains between toughening zone 27 and welding zone 8. The entire thickness of cover substrate 5 may then be added up of HL+MM+DoL.

The functional area 13, 13a extends inwards of the toughened layers 27, 28, 29, with the toughened layer 28 being provided in an area laterally surrounding the functional area 13, 13a. Thus, in the embodiment shown in FIGS. 5A, 5B, the cover substrate 5 and also the base substrate 3 were toughened on both of its major sides, in particular chemically toughened in a toughening solution. In other words, the substrates 3, 5 were dipped into a toughening solution for being chemically toughened at their respective major sides, i.e. the respective upper and lower surfaces, for toughening the major sides.

In the embodiment shown in FIG. 5A, the package 1 is toughened on all outer surfaces, i.e. both the two opposite major surfaces have toughened layers 27 and 29, and the circumferential edge 14 of the package has a toughened layer 28, the circumferential edge 14 extending circumferentially around the package 1. In other words, in the case of a cuboid package, all four narrow sides that are found on a cuboid jointly form the edge 14. The edge 14 can also be understood or referred to as an edge 21 of the package, which extends around the cavity. A package 1 as shown in FIG. 5A can be obtained, for example, by immersing the finally welded package comprising the cover substrate 5 and the base substrate 3 in a toughening solution and in particular chemically toughening it there. The toughened layers 27, 28, 29 are thus disposed directly at the outer surfaces of the package 1. Thus, inwards of the toughened layers 27, 28, 29 there remains an area for the welding line 8, which is introduced with a spacing to the toughened layers 27, 28, 29, if possible.

Figure 5B:
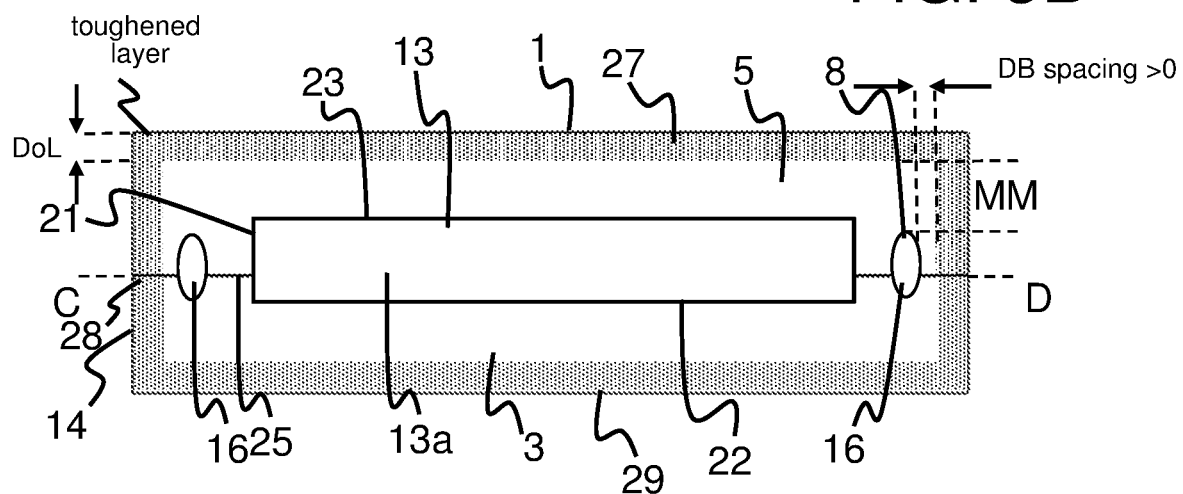

FIG. 5B shows an embodiment of the package 1 in a sectional view taken along line C-D. Again, in this embodiment, the functional area 13, 13a is arranged such that it extends from the base substrate 3 into the cover substrate 5, for example in the form of a recess in the respective substrate. Such a recess 13, 13a can be produced by a sandblasting process. Welding line 8 is provided all around the recess 13, 13a, so that the recesses 13, 13a are hermetically sealed on all sides.

As in the embodiment of FIG. 5A, the package 1 is chemically toughened on all sides, in other words, it has a toughened zone 27, 28, 29 on all surfaces thereof. For example, a first toughened layer 27 is provided at the first major side which may be the upper surface of the cover substrate 5, a third toughened layer 29 is provided on a second major side which may be the lower surface of the base substrate 3, and the second toughened layer 28 is provided at the peripheral edge 21 or circumferential edge 14. The upper side 23 of the cavity is located inwards of the first toughened layer 27, the edge 21 of the cavity is located inwards of the second toughened layer 28, and the bottom 22 of the cavity is located inwards of the third toughened layer 29. Thus, the cavity or functional area 13, 13a is enclosed by toughened material 27, 28, 29 on all of its sides.

Figure 6:
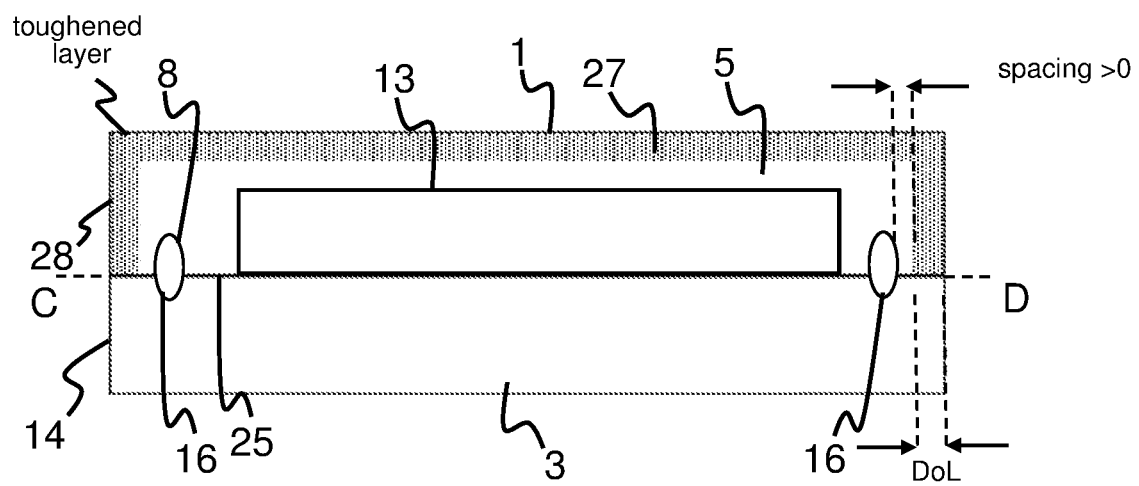

FIG. 6 shows a further exemplary embodiment of a package 1 along section line C-D, and in this example the functional area 13 or the cavity 12 is provided in the cover substrate 5. For example, only the cover substrate 5 may be hollowed out by the sandblasting process in this example, whereas the base substrate 3 does not have to be treated any further. Thus, manufacturing can be simplified since fewer parts of the package have to be processed.

In this example of FIG. 6, the cover substrate 5 has the toughening layer 27 on its major side and the toughening layer 28 on its edge 14. For example, the cover substrate 5 was dipped into a toughening solution, individually or after having been joined to the base substrate 3, with the upper surface of cover substrate 5 immersed in a toughening solution for chemical toughening to such an extent that the height of the second toughened layer 28 is achieved. In the present example, the base substrate 3 does not have any toughened zones. In this example, the lateral toughened zone 28 terminates directly at the contact area 25 between cover substrate 5 and base substrate 3. The joint along welding line 8 was made inwards of the toughening zone 28, that is in relaxed material. In other words, a first major side of the package 1 has the toughened layer 27, and a first minor side 14 has the toughened layer 28 along a section thereof. The toughened layer 28 may extend circumferentially around the package 1, for example around functional area 13. The sectional view shown here is taken along line C-D as indicated in FIG. 3, that is cutting through the functional area 13. In this embodiment, the functional area 13 is limited to the dimensions of cover substrate 5, so it does not extend into base substrate 3. The base substrate 3 is directly joined to the cover substrate 5, i.e. there is no further layer or no further substrate arranged between base substrate 3 and cover substrate 5. Functional area 13 is in the form of a cavity. The cavity may be introduced into the cover substrate 5 by a sandblasting process, for example, more generally by using an abrasive technique. Chemical etching is also possible for creating the cavity in the substrate.

Reference is now made to FIG. 7, which shows an exemplary embodiment of a method for producing a package 1. The process begins in a temperature range which is below the temperature at which the package is to be used later. In a step A, the wafers 3, 4, 5 and the accommodation items 2 to be accommodated are aligned. The upper wafer 5 is placed on the intermediate wafer 4 which in turn is placed on the lower wafer 3 such that a substrate stack or wafer stack 18 is formed. The intermediate layer 4 has a different characteristic value of the coefficient of thermal expansion (CTE) than the lower layer 3 and also than the upper layer 5. Since the intermediate wafer 4 which includes the recesses which define the cavities 12 is arranged in a sandwiched relationship, the accommodation cavities 12 will subsequently be enclosed by wafer material on all sides. In other words, aligning the substrates in step A creates the enclosed nature of the cavity surrounded all around by edge 21, bottom 22, and upper side 23. Optionally, the substrates may be joined to one another, in particular fixed by optical contact bonding, for example, to secure them in position.

Step B of the method illustrated in FIG. 7 shows the stack of wafers 18 arranged one above the other, with cavities 12 for receiving accommodation items 2 provided in the interior thereof. Optionally, the substrate stack or wafer stack 18 is bonded by optical contact bonding. In this closed form, this substrate stack or wafer stack 18 can be fed to the welding process, in which the layers are welded together to form a firmly bonded stack 18, so that integral packages 1 are obtained therefrom.

Step C shows the laser welding of the respective accommodation cavities 12, that is the sealing of the cavities 12 on all sides along the contact areas. For this purpose, a laser unit 15 is guided over the surface of the stack 18 from above the stack 18 and a focused laser beam 9 is selectively directed to the zones to be joined. The laser welding lines may, for example, be created in the form of a grid of intersecting lines. Drawing two or more laser welding lines in parallel can also be implemented if this proves to be advantageous for later dicing, for example, depending on the material. Once step C of the fabrication process has been completed, all of the cavities will be hermetically sealed.

Step D shows the step of separating or cutting the stack 18 for dicing the packages 1. Here, the stack 18 is cut or separated along separation or cutting lines 10. Up to this step, the temperature may be kept constant or consistent in a temperature range just below the temperature at which the packages will later be used.

Step E finally shows the hermetically sealed and toughened package 1 with the accommodation cavity 12 provided therein. Once the aforementioned processing steps have been completed, the temperature can be brought back to normal temperature, i.e. in particular to ambient temperature.

Figure 8:
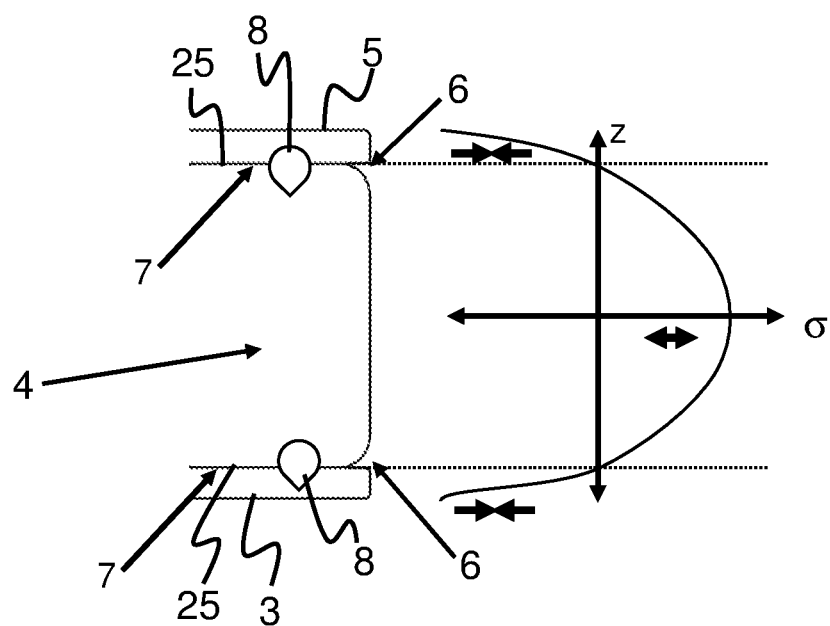
FIG. 8 illustrates the package with prevailing prestress.

Reference is now made to FIG. 8, which shows a detailed view of the joining area or a sectional side view of a package 1 illustrating the welded fusing areas 8 in contact area 25. Since the intermediate layer 4 has a higher characteristic value of the thermal expansion coefficient CTE than the lower layer 3 and also than the upper layer 5, thermal prestress is established along the illustrated z-direction, which in turn results in a higher strength of the finished package 1.

The prevailing prestress of the substrate stack is not relieved by the laser bond. This is due to the only very limited fusion points of the bonding profile of the laser bonding line typical for the present invention, which is a result of the ultrashort pulses. The laser welding zone can be identified in the finished end product, for example by the specific local change in the refractive index of the material in the small fusion area.

It will be apparent to a person skilled in the art that the embodiments described above are meant to be exemplary and that the invention is not limited thereto but may be varied in many ways without departing from the scope of the claims. Furthermore, it will be apparent that irrespective of whether disclosed in the description, the claims, the figures, or otherwise, the features individually define essential components of the invention, even if they are described together with other features. Throughout the figures, the same reference symbols designate the same pieces of subject-matter, so that a description of pieces of subject-matter that are possibly only mentioned in one or at least not in conjunction with all figures can also be transferred to such figures with regard to which the piece of subject-matter has not explicitly been described in the specification.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE NUMERALS

1 Hermetically sealed, chemically toughened package
2 Accommodation item
3 Lower substrate, layer, or wafer, base substrate, or lower cover
4 Intermediate substrate, intermediate layer, or intermediate wafer
5 Upper substrate, layer, or wafer, cover substrate, or upper cover
6 Corner of laser-welded stack 18
7 Laser-welded interface zone
8 Laser welding zone, laser bonding line
9 Focused laser beam
10 Separation or cutting lines
12 Accommodation cavity
13 Functional area
13a Second functional area
14 Edge
15 Laser unit for welding and/or cutting
16 Laser pulse impact area
18 Stack
21 Edge
22 Bottom of cavity
23 Upper side of cavity
25 Contact area or interface between two substrates
27 Toughened zone or first toughened layer
28 Toughened zone or second toughened layer
29 Toughened zone or third toughened layer

What is claimed is:

1. A hermetically sealed package, comprising:
at least one cover substrate and a base substrate arranged adjacent to the at least one cover substrate, which together define at least part of the package, the at least one cover substrate being in a thermally prestressed state and hermetically sealed to the base substrate by at least one laser bonding line, the at least one cover substrate being made of a material which has a different characteristic value of a coefficient of thermal expansion (CTE) than the base substrate and a thermal prestress is established in the package;
an intermediate substrate disposed between the at least one cover substrate and the base substrate, the base substrate being joined to the intermediate substrate in a first bonding plane and the at least one cover substrate being joined to the intermediate substrate in a second bonding plane, the intermediate substrate having a higher characteristic value of a coefficient of thermal expansion both in comparison to the at least one cover substrate and in comparison to the base substrate; and
at least one functional area enclosed in the package.

2. The hermetically sealed package of claim 1, wherein the at least one laser bonding line circumferentially encloses the at least one functional area at a distance therefrom.

3. The hermetically sealed package of claim 1, wherein the at least one functional area comprises a hermetically sealed accommodation cavity for receiving an accommodation item.

4. The hermetically sealed package of claim 3, wherein the at least one cover substrate defines an upper side of the accommodation cavity, the intermediate substrate defines a lateral circumferential edge of the accommodation cavity, and the base substrate defines a bottom of the accommodation cavity, which together completely enclose the accommodation cavity.

5. The hermetically sealed package of claim 4, wherein at least one of the lateral circumferential edge, the bottom, or the upper side is at least partially transparent for some range of wavelengths.

6. The hermetically sealed package of claim 1, further comprising a marker that is incorporated in at least one of the at least one cover substrate, the intermediate substrate, or the base substrate.

7. The hermetically sealed package of claim 1, wherein the thermal prestressing is achieved by using materials having a different coefficient of thermal expansion (CTE) and through a suitable temperature.

8. An arrangement for producing a package, the arrangement comprising:
a first substrate made of at least partially transparent material; and
a second substrate arranged immediately adjoining the first substrate, the second substrate being made of a material having a higher characteristic value of a coefficient of thermal expansion than a material of the first substrate, the first substrate being joined to the second substrate by a laser welding process at a bonding temperature that is higher than a later use temperature of the package or is below the later use temperature of the package, wherein a compressive stress towards the second substrate is established in the first substrate at a temperature below the bonding temperature or a compressive stress towards the second substrate is established in the first substrate at a temperature above the bonding temperature.

9. The arrangement of claim 8, wherein at least one of the following is satisfied:
the first substrate is a glass substrate or a glass ceramic substrate; or
a tensile stress is established in the second substrate.

10. A method for providing a plurality of hermetically sealed packages, each package accommodating a functional area or defining a cavity that is enclosed by a laterally circumferential edge, a bottom, and an upper side of the package, and wherein the cavities are in the form of accommodation cavities for receiving electronic circuits, sensors, or micro-electromechanical systems, the method comprising:
providing a first substrate and at least one second substrate, the at least one second substrate being made of transparent material and being a transparent substrate, and the at least one second substrate having a characteristic value of a coefficient of thermal expansion (CTE) which differs from a characteristic value of a coefficient of thermal expansion (CTE) of the first substrate;
arranging the first substrate and the at least one second substrate so as to directly adjoin each other or on top of one another, with the at least one second substrate defining a respective edge of a respective package of the cavities to be sealed, the first substrate defining a respective bottom of the respective package, and wherein a contact area is defined at contact surfaces between the first substrate and the at least one second substrate so that each package includes at least one contact area;
providing a cover substrate as a third substrate, the at least one second substrate comprising an intermediate substrate arranged between the cover substrate and the first substrate, the intermediate substrate comprising more than one transparent substrate that together form the respective edge of the cavities;
sealing the cavities in a hermetically tight manner by bonding the first substrate and the at least one second substrate along the at least one contact area of each package; and
dicing the respective package by a cutting step or a separation step.

11. The method of claim 10, wherein the at least one intermediate substrate has a higher coefficient of thermal expansion (CTE) than at least one of the first substrate or a third substrate, the method further comprising:
prior to performing the sealing, heating the packages to a bonding temperature that is higher than a temperature during later use of the packages and performing the sealing at the bonding temperature.

12. The method of claim 11, wherein the dicing is performed before the packages are allowed to cool down to ambient temperature from the bonding temperature.

13. The method of claim 10, wherein sealing of the cavities is at least one of:
accomplished using a laser welding process; or
performed at a temperature that is lower or higher than a temperature during later use of the package.

14. The method of claim 10, wherein the at least one second substrate is made of a material selected from the group consisting of glass, glass ceramics, silicon, sapphire, and a combination of the aforementioned materials; or wherein the at least one second substrate is made of ceramic material.

15. The method of claim 10, wherein the first substrate and the at least one second substrate are provided in the form of a wafer stack comprising at least two wafers for jointly producing a plurality of hermetically sealed packages from the wafer stack in one and the same fabrication process.

16. The method of claim 15, wherein at least one of the following is satisfied:
the at least two wafers are made of a material selected from the group consisting of glass, glass ceramics, silicon, sapphire, and a combination of the aforementioned materials;
at least one wafer of the at least two wafers comprises a material different from the at least one second substrate provided in the form of an intermediate wafer; or
all wafers of the wafer stack are made of transparent material.

17. The method of claim 10, wherein the dicing step for a respective package is performed by a laser cutting step or a laser separation step.

18. The method of claim 10, wherein at least one of the first substrate or a third substrate have a thickness of less than 500 μm.

19. The method of claim 10, wherein prior to the sealing of the first substrate and the at least one second substrate along the at least one contact area of each package, the first substrate and the at least one second substrate are at least temporarily bonded to one another by optical contact bonding.

20. The arrangement of claim 8, wherein the bonding temperature is 5° K higher than the later use temperature.

* * * * *

UNITED STATES PATENT AND TRADEMARK OFFICE
CERTIFICATE OF CORRECTION

| | | |
|---|---|---|
| PATENT NO. | : 11,975,962 B2 | Page 1 of 1 |
| APPLICATION NO. | : 17/582514 | |
| DATED | : May 7, 2024 | |
| INVENTOR(S) | : Jens Ulrich Thomas et al. | |

It is certified that error appears in the above-identified patent and that said Letters Patent is hereby corrected as shown below:

In the Specification

Column 8
At Lines 39 and 40, please delete "substrate (s)", and substitute therefore --substrate(s)--.

Signed and Sealed this
Twenty-third Day of December, 2025

John A. Squires
*Director of the United States Patent and Trademark Office*